United States Patent [19]

Tsuruno et al.

[11] Patent Number: 5,134,373
[45] Date of Patent: Jul. 28, 1992

[54] MAGNETIC RESONANCE IMAGING APPARATUS EMPLOYING OPTICAL VIEWING SCREEN

[75] Inventors: Daihachiro Tsuruno; Kouzi Kitamura, both of Tochigi; Satoshi Sugiura, Ootawara, all of Japan

[73] Assignee: Kabushiki Kaisha Toshiba, Kawasaki, Japan

[21] Appl. No.: 727,306

[22] Filed: Jul. 10, 1991

Related U.S. Application Data

[63] Continuation of Ser. No. 330,703, Mar. 30, 1989, abandoned.

[30] Foreign Application Priority Data

Mar. 31, 1988 [JP] Japan .................................. 63-76027

[51] Int. Cl.⁵ .......................................... G01R 33/20
[52] U.S. Cl. .................................... 324/309; 358/901; 128/653.1; 359/443; 359/872
[58] Field of Search ................ 378/99; 324/300, 306, 324/307, 309, 312, 318, 322; 128/653 SC; 351/158; 358/901; 350/612

[56] References Cited

U.S. PATENT DOCUMENTS

| | | | |
|---|---|---|---|
| 4,516,582 | 5/1985 | Redington | 324/309 |
| 4,521,733 | 6/1985 | Bottomley | 324/309 |
| 4,536,712 | 8/1985 | Iwaoka | 324/309 |
| 4,609,872 | 9/1986 | O'Donnell | 324/306 |
| 4,650,299 | 3/1987 | Stevens et al. | 350/626 |
| 4,804,261 | 2/1989 | Kirschen | 351/158 |
| 4,901,141 | 2/1990 | Costello | 358/901 |

Primary Examiner—Michael J. Tokar
Attorney, Agent, or Firm—Foley & Lardner

[57] ABSTRACT

In a magnetic resonance imaging apparatus wherein an object under examination is positioned within a imaging hole so as to acquire magnetic resonance imaging information derived therefrom by causing a magnetic resonance phenomenon therein, there are provided an image information source for producing image information other than the magnetic resonance imaging information; an optical unit for optically transferring the image information derived from the image information source; and, a viewing screen positioned within the imaging hole, on which the image information optically transferred from the optical unit is optically projected, whereby the object under examination can observe the image information projected on the viewing screen.

12 Claims, 2 Drawing Sheets

MAGNETIC RESONANCE IMAGING APPARATUS EMPLOYING OPTICAL VIEWING SCREEN

This application is a continuation of application Ser. No. 07/330,703, filed Mar. 30, 1989, now abandoned.

BACKGROUND OF THE INVENTION

1. Field of the Invention

The present invention generally relates to a magnetic resonance imaging apparatus for obtaining a magnetic resonance information signal of an object (patient) under medical examination. More specifically, the present invention is directed to a magnetic resonance imaging apparatus employing a viewing screen which is observed by the patient during the medical examination.

2. Description of the Related Art

A magnetic resonance imaging apparatus per se is known in the art from, for instance, Japanese Laid-open (KOKAI) Patent Application No. 63-262146 (opened on Oct. 28, 1988). The typical operation of the magnetic resonance imaging apparatus is as follows. A uniform static magnetic field is produced at a desired examining portion of an object under medical examination. A magnetic resonance phenomenon is caused only in a specific slice portion of the object, from which magnetic resonance computerized tomographic images are acquired, by employing a transmitting RF (radio frequency) coil for forming an RF magnetic field perpendicular to this static magnetic field. After the RF magnetic field is deprived from the slice portion, magnetic resonance imaging signals generated from nuclei are received by a receiving RF coil. In addition, gradient magnetic fields are given to the above static field, which have linear gradients with respect to an X'-axis direction (i.e., a coordinate system rotated by an angle from an X axis). As a result, a synthesized magnetic resonance signal is obtained, and thereafter Fourier-transformed in order to obtain various projection information of the slice portion in the predetermined directions within the X-Y plane while rotating the X'-axis in the X-Y plane. As a consequence, a desired computerized tomographic image of the slice portion can be acquired.

In the above-described conventional magnetic resonance imaging apparatus, there is a drawback that since an object under examination is completely inserted into a cylindrical hole having a typical length of 200 cm and a typical diameter of 60 cm of a gantry, he feels anxieties and/or claustrophobia during an examination time. The static magnetic field coil, gradient field coils and other MRI components are mounted on this gantry. A typical examination period is about 1.5 to 2 hours. Specifically, in accordance with the MRI (magnetic resonance imaging) system for acquiring the MRI signals in synchronism with a cardiac beat of a patient, adverse influences in view of medical considerations are given to the acquired MRI signals of the patient who is under such a bad psychological condition.

The present invention has been made in an attempt to solve the above-described problems, and therefore has an object to provide a magnetic resonance imaging apparatus by which a patient is substantially freed himself from the above-described medical conditions and/or psychological problems, e.g., claustrophobia.

SUMMARY OF THE INVENTION

The above-described object of the invention is achieved by providing a magnetic resonance imaging apparatus wherein an object (P) under examination is positioned within an imaging hole (2) so as to acquire magnetic resonance imaging information derived therefrom by causing a magnetic resonance phenomenon therein, comprising:

an image information source (3:3A) for producing image information other than the magnetic resonance imaging information;

an optical transfer unit (17:26) for optically transferring the image information derived from the image information source (3:3A) ; and, a viewing screen (15) positioned within the imaging hole (2), on which the image information optically transferred from the optical transfer unit (17:26) is optically projected, whereby the object under examination can observe the image information projected on the viewing screen (15).

In the magnetic resonance imaging apparatus according to the present invention, the object under examination can observe visual information within the magnetic resonance imaging hole of the gantry so that anxieties and claustrophobia can be minimized. As a result, the object under examination such as a patient becomes relaxative during the MRI examination. Moreover, as is known in the art, various magnetic fields are produced within the imaging hole and the signal levels of the MRI signals emitted from the object are extremely low. Thus, if an electric conductive cable would be employed to transmit a video signal within the imaging hole of the gantry, the magnetic fields and MRI signals could be necessarily disturbed. However, according to the invention, the video signal is once converted into the corresponding optical signal. Then, the optical signal is optically transmitted via optical light transfer means within the imaging hole. The patient can observe image information such as television programs, and video programs, and thereby can relax his tense mind without deteriorating of the MRI signals.

BRIEF DESCRIPTION OF THE DRAWINGS

For a better understanding of the present invention, reference is made to the following descriptions in conjunction with the accompanying drawings, in which.

DETAILED DESCRIPTION OF THE PREFERRED EMBODIMENTS

Arrangement of First Image Displaying System

Figure 1:
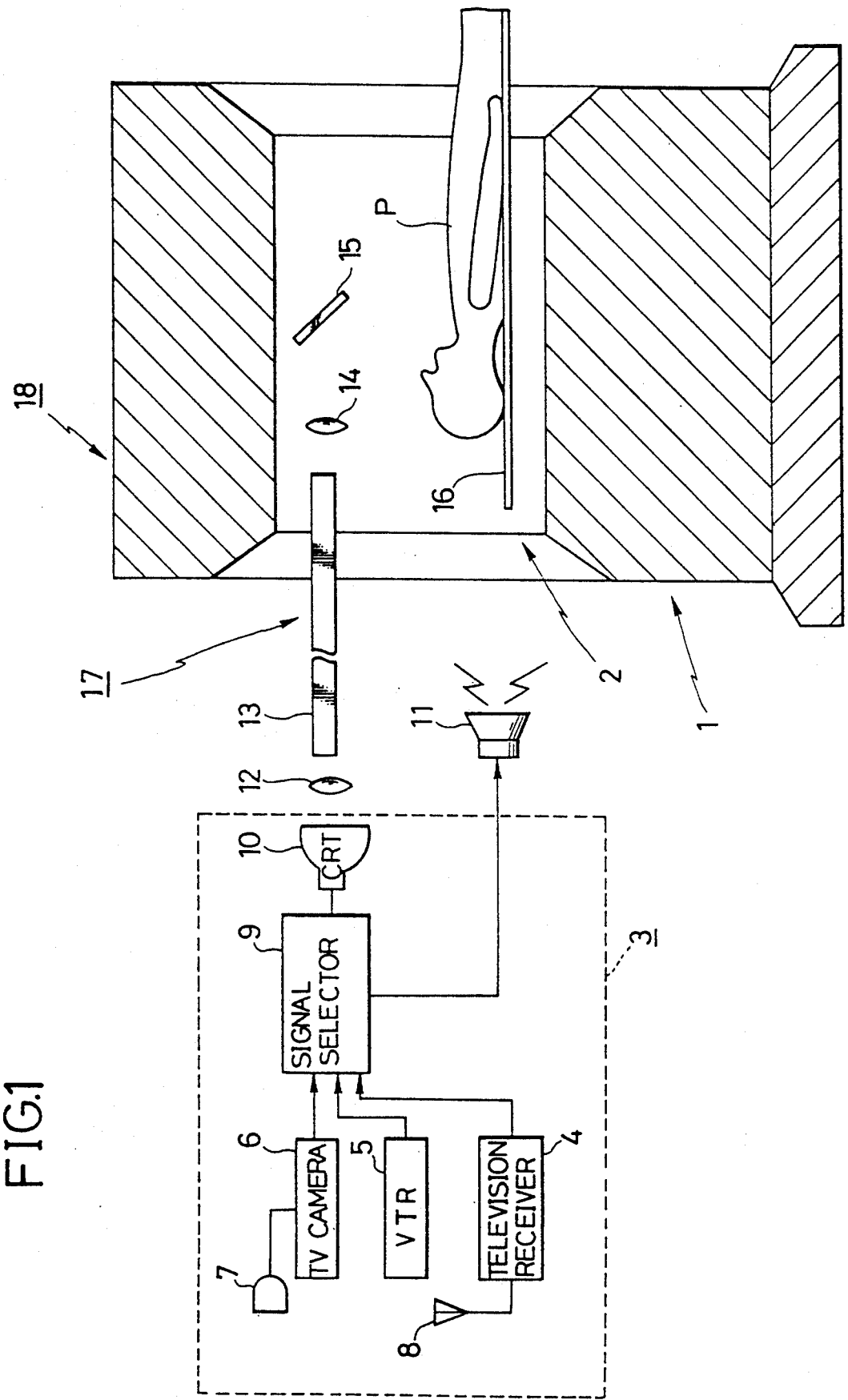
FIG. 1 is a schematic diagram of a magnetic resonance imaging apparatus according to a first preferred embodiment of the invention; and, FIG. 2 is a schematic diagram of a magnetic resonance imaging apparatus according to a second preferred embodiment of the invention.

FIG. 1 illustrates a schematic diagram of a magnetic resonance imaging apparatus according to a first preferred embodiment of the invention.

In the magnetic resonance imaging (referred to as an "MRI") apparatus, a gantry 1 is equipped with a coil unit for generating various types of magnetic fields. The gantry has a magnetic resonance (MR) imaging hole 2 at its central area. An object under examination such as a patient "P" is set on a couch 16 and then inserted into the MR imaging hole 2 for an MR imaging purpose.

As previously described, a typical length of the MR imaging hole 2 (i.e., a horizontal direction as viewed in FIG. 1) is selected to be approximately 2 meters, whereas a typical diameter thereof is about 60 cm. Thus, generally speaking, a whole patient "P" is completely stored within this imaging hole 2. As a consequence, he can surely feel anxieties and/or claustrophobia during the normal examination time, e.g., 1.5 to 2 hours.

Referring back to FIG. 1, an image information source 3 is provided apart from the gantry 1. For instance, this source 3 is installed within the operation room, or shield room (not shown in detail). In the image information source 3, a television camera 6 equipped with a microphone 7, a video tape recorder 5, and a commercial broadcasting television receiver 4 equipped with an antenna 8 are connected to a signal selector 9. A CRT (cathode-ray tube) display 10 and a speaker 11 are connected to this signal selector 10. A major function of the television camera 6 is to image an operator, e.g., a doctor who is operating the MRI apparatus within the operation room. The microphone 7 receives a voice of the operator who instructs the patient "P". The video tape recorder 5 mainly reproduces the video programs previously recorded on the tapes and the TV receiver 4 receives the broadcasting programs. Various types of image information such as the video programs and broadcasting programs are selected in the signal selector 9 so that the selected image information is displayed on the screen of the CRT display 10, and the sound signal thereof is reproduced by the speaker 11 to which the patient "P" can listen.

The image displayed on the screen of the CRT display 10 is optically transferred via a lens 12, an optical fiber 13, and another lens 14 and projected onto a viewing screen 15 which is positioned within the imaging hole 2 of the gantry 1. These lenses 12, 14 and optical fiber 13 construct an image information transfer means 17 formed by, for instance, a tandem type optical system. Both the image information transfer means 17 and the viewing screen 15 constitute an image display system 18. Thus this image display system 18 is optically coupled to the image information source 3.

Operation of First Image Displaying System

The outputs derived from the television camera 6, video tape recorder 5 and television receiver 4 are properly selected in the signal selector 9. The signal selector 9 simultaneously selects both the sound signal and image signal. The selected sound signal is sent to the speaker 11, whereas the image signal is transferred to the CRT display 10. The images displayed on the screen of the CRT display 10 are optically acquired within the MR imaging hole 2 of the gantry 1 via the image information transfer means 17, e.g., the optical fiber 13. Thereafter, the optically transferred image information is projected onto the viewing screen 15. The patient "P" can observe the image information, e.g., TV programs projected on the viewing screen 15.

As a result, since the patient may enjoy watching a desired program projected on the viewing screen 15 during the long MRI examination time period, the psychological pressure applied to the patient "P" can be considerably mitigated. In addition, the image information is, not electronically, but optically transferred to the interior of the imaging hole 2 of the gantry 1 in the MRI apparatus, so that neither magnetic fields an MRI signal is electrically disturbed. Therefore, acquired MRI signals can maintain the better signal qualities.

Second Image Displaying System

Figure 2:
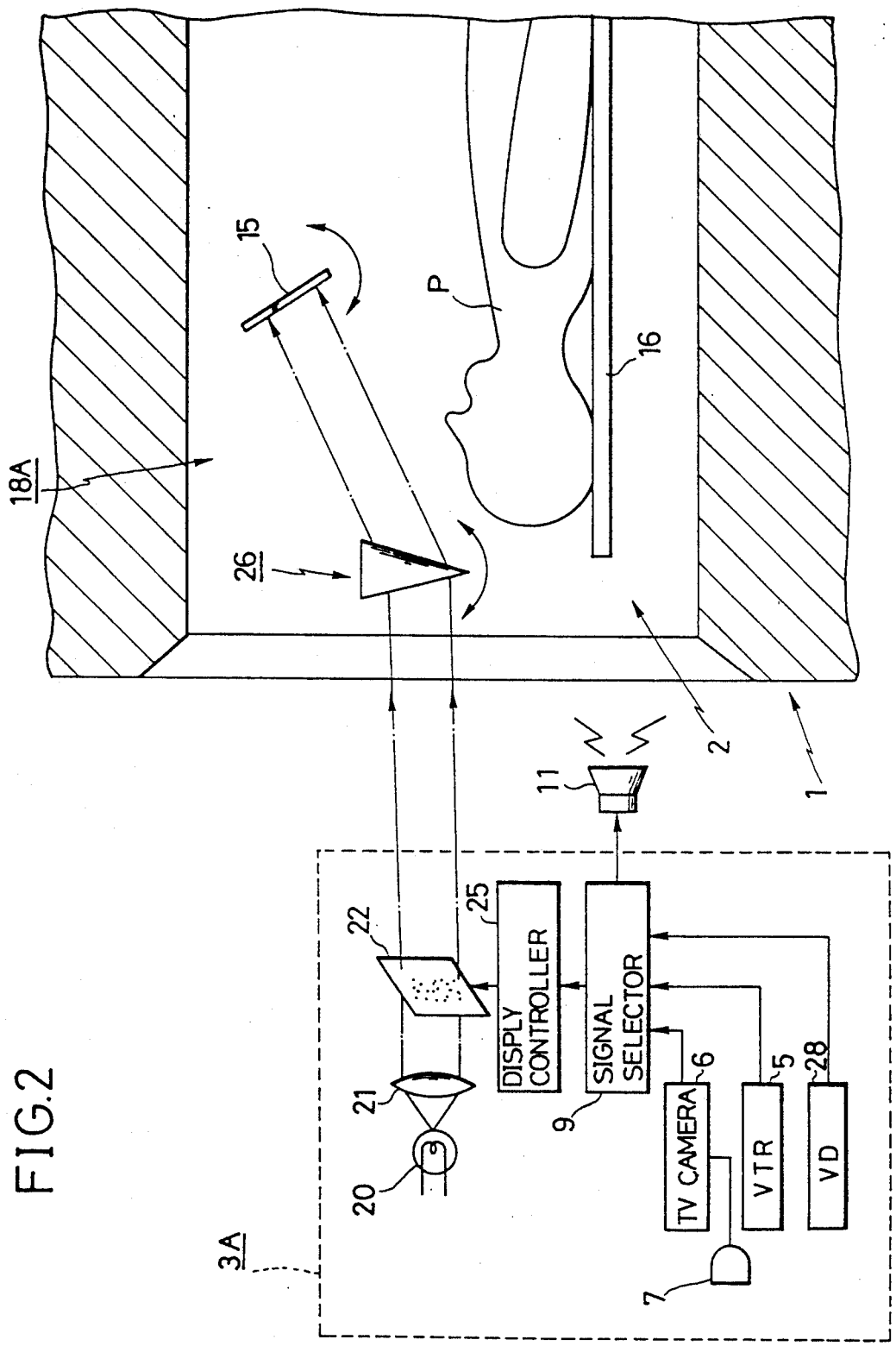

Referring now to FIG. 2, a magnetic resonance imaging apparatus according to a second preferred embodiment of the invention will be described.

It should be noted that the same reference numerals shown in FIG. 1 are employed for denoting the same or similar elements shown in FIG. 2.

In FIG. 2, the TV camera 6 equipped with the microphone 7, a VTR 5 and a video disk 28 are connected to the signal selector 9 to which the speaker 11 is also connected.

The selected output signal from the signal selector 9 is supplied via a display controller 25 to a liquid crystal display 22. A light source 20 and a lens 21 function as a back lighting for the liquid crystal display 22. These components constitute an image information source 3A.

An image displayed on the liquid crystal display 22 is projected via a prism 26 onto the viewing screen 15. In the preferred embodiment, both the prism 26 and viewing screen 15 are cooperated and pivoted around a predetermined center (not shown in detail), as illustrated in FIG. 2, with maintaining a preselected optical relationship. As a result, when the setting angle of the viewing screen 15 is adjusted, the setting angle of the prism is similarly corrected, keeping such an optical relationship so as to prevent the image displayed on the viewing screen 15 from being distorted.

In the second preferred embodiment, an image information transfer means includes the prism 26, and an image display system 18A is constructed by this image information transfer means 26 and the viewing screen 15.

It should be noted that although the angle setting mechanism for this image display system 18A is not definitely shown in FIG. 2, any sort of known mechanism may be employed. A flexible arm (tradename), commercially available, may be utilized as the angle setting mechanism. Similarly, a flexible arm may be employed as the supporting mechanism for the optical system shown in FIG. 1.

According to the MRI apparatus with the above-described arrangement, the patient "P" can similarly observe, for instance, the video program displayed on the viewing screen 15 during the MRI examination, and either anxieties or claustrophobia can be considerably minimized for the patient. In addition, the image information optical transfer means does not interfere the various magnetic fields and MRI signals.

As apparent from the foregoing descriptions, the present invention is not limited to the above-described preferred embodiments, but may be modified without departing from the technical scope of the invention.

As the viewing screen, any sorts of materials, e.g., cloth, paper, and non-transparent treated acrylic resin may be utilized unless eddy current is produced therein.

Even when another material containing water is employed to form the viewing screen, and therefore the MRI signal is generated therefrom, such a material may be utilized because this MRI signal can be discriminated from the MRI signals derived from the patient.

As has been described in detail, in the MRI apparatus according to the invention, the psychological pressure, e.g., claustrophobia applied to the patient who is completely inserted into the imaging hole of the gantry, can be considerably mitigated. Moreover, the equalities of the acquired MRI signals can be improved.

What is claimed is:

1. A magnetic resonance imaging apparatus wherein an object under examination is positioned within an imaging hole to acquire magnetic resonance imaging information derived by causing a magnetic resonance phenomenon in the object, the magnetic resonance imaging apparatus comprising:

an image information source producing image information other than the magnetic resonance imaging information, and displaying the image information on a display positioned in the image information source;

optical transferring means including at least a prism movable with respect to an optical axis of said optical transferring means, for optically transferring the image information displayed on the display via the prism; and, a viewer, movable with respect to said optical axis in relation to said optical transferring means, positioned within the imaging hole and not attached to the object, from which the image information optically transferred from the display via the prism is reflected toward the object.

2. A magnetic resonance imaging apparatus as claimed in claim 1, wherein said image information source also produces sound information such that the object under examination can listen to the sound information.

3. A magnetic resonance imaging apparatus as claimed in claim 2, wherein said image information source includes a television camera equipped with a microphone such that the object under examination observes information of an operator while listening to an instruction of the operator.

4. A magnetic resonance imaging apparatus as claimed in claim 3, wherein said image information source includes a video tape recorder such that the object under examination observes a video program reflected from the viewer means.

5. A magnetic resonance imaging apparatus as claimed in claim 3, wherein said image information source includes a video disk player such that the object under examination observes a video disk program reflected from the viewer means.

6. A magnetic resonance imaging apparatus as claimed in claim 2, wherein said display includes a liquid crystal display device.

7. A magnetic resonance imaging apparatus as claimed in claim 6, further comprising:

a lamp; and a lens through which light emitted from the lamp is transferred to a back surface of the liquid crystal display device.

8. A magnetic resonance imaging apparatus as claimed in claim 2, wherein said optical transferring means includes a prism.

9. A magnetic resonance imaging apparatus as claimed in claim 8, wherein both said prism and viewer are mounted on a setting angle adjusting mechanism such that both the prism and viewer means are pivotable with respect to predetermined pivot centers.

10. A magnetic resonance imaging apparatus as claimed in claim 1, wherein said viewer includes a screen made of a cloth.

11. A magnetic resonance imaging apparatus as claimed in claim 1, wherein said viewer includes a screen made of paper.

12. A magnetic resonance imaging apparatus as claimed in claim 1, wherein said viewer includes a screen which is made of non-transparent treated resin.

* * * * *